(12) United States Patent
Nakamura et al.

(10) Patent No.: US 8,830,144 B2
(45) Date of Patent: Sep. 9, 2014

(54) DISPLAY PANEL AND DISPLAY DEVICE (75) Inventors: Kazuo Nakamura, Kanagawa (JP); Katsuhide Uchino, Kanagawa (JP); Nobutoshi Asai, Kanagawa (JP); Hiroshi Sagawa, Kanagawa (JP)

(73) Assignee: Sony Corporation (JP)

( * ) Notice: Subject to any disclaimer, the term of this patent is extended or adjusted under 35 U.S.C. 154(b) by 440 days.

(21) Appl. No.: 12/661,248

(22) Filed: Mar. 12, 2010

(65) Prior Publication Data
US 2010/0245216 A1   Sep. 30, 2010

(30) Foreign Application Priority Data

Mar. 27, 2009 (JP) ................. P2009-078801

(51) Int. Cl.
*G09G 3/30* (2006.01)
*H01L 27/32* (2006.01)
*H01L 51/52* (2006.01)

(52) U.S. Cl.
CPC ........... *H01L 27/3269* (2013.01); *H01L 27/322* (2013.01); *H01L 51/5284* (2013.01)
USPC .......................................................... 345/76

(58) Field of Classification Search
USPC ..................................................... 345/76, 55
See application file for complete search history.

(56) References Cited

U.S. PATENT DOCUMENTS

| 6,933,532 | B2 * | 8/2005 | Arnold et al. | 257/80 |
|---|---|---|---|---|
| 7,397,065 | B2 * | 7/2008 | Tseng et al. | 257/72 |
| 7,833,633 | B2 * | 11/2010 | Lee et al. | 428/690 |
| 2006/0139254 | A1 * | 6/2006 | Hayakawa et al. | 345/76 |
| 2007/0046590 | A1 * | 3/2007 | Umezaki et al. | 345/76 |
| 2010/0201275 | A1 * | 8/2010 | Cok et al. | 315/158 |

FOREIGN PATENT DOCUMENTS

| JP | 1126055 A | 5/1989 |
|---|---|---|
| JP | 07-325319 A | 12/1995 |
| JP | 2000-221908 A | 8/2000 |
| JP | 2002-314756 A | 10/2002 |
| JP | 2002-351403 A | 12/2002 |
| JP | 2003-173869 A | 6/2003 |
| JP | 2006-251201 A | 9/2006 |
| JP | 2007-079200 A | 3/2007 |
| JP | 2008-091037 A | 4/2008 |

OTHER PUBLICATIONS

Office Action from Japanese Application No. 2013-097302, dated Feb. 4, 2014.

* cited by examiner

*Primary Examiner* — Jonathan Boyd
(74) *Attorney, Agent, or Firm* — Lerner, David, Littenberg, Krumholz & Mentlik, LLP (57) ABSTRACT

A display panel includes: a plurality of pixel circuits formed in a matrix on a substrate; an insulating layer covering the plurality of pixel circuits; a plurality of light emitting elements connected to the plurality of pixel circuits, and arranged in a matrix on the insulating layer; a filtering layer including a light transmitting section at least in a part of a region facing the light emitting element and a light shielding section formed in a same plane as the light transmitting section, and formed on an opposite side from the pixel circuit in relation to the light emitting element; a light reflecting section formed in a region facing the light shielding section, and between the light emitting element and the filtering layer; and a light receiving element formed in a region facing the light shielding section, and on the pixel circuit side in relation to the light emitting element.

9 Claims, 9 Drawing Sheets

POWER-OFF SIGNAL INPUT                POWER-OFF

FIG. 13

DISPLAY PANEL AND DISPLAY DEVICE

CROSS-REFERENCE TO RELATED APPLICATION

The present application claims priority from Japanese Patent Application No. JP 2009-078801 filed in the Japanese Patent Office on Mar. 27, 2009, the entire content of which is incorporated herein by reference.

BACKGROUND OF THE INVENTION

1. Field of the Invention

The present invention relates to a backlight and a displaying/imaging apparatus having the same.

2. Description of the Related Art

Recently, in the field of a display device displaying an image, a display device using a current drive type optical element whose light emission luminance changes in accordance with the value of a flowing current, for example, an organic EL (electroluminescence) element as a light emitting element of a pixel has been developed and progressively commercialized. Unlike a liquid crystal element and the like, the organic EL element is a self-luminous element. Thus, a light source (backlight) is unnecessary in the display device using the organic EL element (organic EL display device), and this enables thinning and high luminance of the display device in comparison with a liquid crystal display device in which the light source is necessary. In particular, in the case where the active matrix method is employed as a driving method, it is possible to light and hold each pixel, and it is possible to realize low power consumption. Thus, the organic EL display device is expected to become the mainstream of a flat panel display in the next generation.

However, in the organic EL element, there is an issue that the element is deteriorated in accordance with a fed current value, and the luminance is reduced. Therefore, in the case where the organic EL element is used as a pixel in the display device, there is a case where the state of deterioration is different in each pixel. For example, in the case where information of time, a display channel, or the like is displayed at high luminance in the same position for a long time, deterioration of only the corresponding pixel is rapid. As a result, in the case where a video having high luminance is displayed in a part including the pixel whose deterioration is rapid, the phenomenon called "burning" in which the display is dark only in the part of the pixel whose deterioration is rapid is generated. Since the burning is irreversible, when the burning once occurs, the burning is not eliminated.

A large number of methods to prevent the burning have been proposed so far. For example, in Japanese Unexamined Patent Publication No. Hei 11-26055, such a method is disclosed that images continuously and fixedly displayed are inverted at a predetermined interval, or are shifted to be displayed. In Japanese Unexamined Patent Publication No. 2002-351403, the method is disclosed where a dummy pixel is provided in a region other than a display region, the deterioration degree of the dummy pixel is estimated by detecting a terminal voltage when the dummy pixel emits light, and a video signal is corrected by utilizing the estimation.

SUMMARY OF THE INVENTION

However, in Japanese Unexamined Patent Publication No. Hei 11-26055, although the method where the image is inverted at the predetermined interval is effective to a monochrome display, there is an issue that the inverted image is completely different from the original image in a color display, and thus it is difficult to apply the method to the display device performing the color display. Moreover, in Japanese Unexamined Patent Publication No. Hei 11-26055, in the method where the image is shifted at the predetermined interval, since the display position is shifted, there is an issue that the method is unsuitable for a still image display. In the method of Japanese Unexamined Patent Publication No. 2002-351403, the deterioration degree of the pixel is not estimated based on the light emission information of the pixel in the display region, and it is difficult to accurately correct the video signal. Therefore, there is an issue that it is difficult to prevent the burning.

In view of the forgoing, it is desirable to provide a display panel capable of reducing a burning in a color display and a still image display, and a display device including the display panel.

According to an embodiment of the present invention, there is provided a first display panel including: a plurality of pixel circuits formed in a matrix on a substrate; an insulating layer covering the plurality of pixel circuits; and a plurality of light emitting elements connected to the plurality of pixel circuits, and arranged in a matrix on the insulating layer. The first display panel includes a filtering layer including a light transmitting section at least in a part of a region facing the light emitting element and a light shielding section formed in a same plane as the light transmitting section, and formed on an opposite side from the pixel circuit in relation to the light emitting element. Moreover, the first display panel includes a light reflecting section formed in a region facing the light shielding section, and between the light emitting element and the filtering layer; and a light receiving element formed in a region facing the light shielding section, and on the pixel circuit side in relation to the light emitting element.

According to an embodiment of the present invention, there is provided a first display device including: a display panel; and a drive circuit section driving the display panel. The display panel mounted on the first display device includes a plurality of pixel circuits formed in a matrix on a substrate, an insulating layer covering the plurality of pixel circuits, a plurality of light emitting elements connected to the plurality of pixel circuits, and arranged in a matrix on the insulating layer, a filtering layer including a light transmitting section at least in a part of a region facing the light emitting element and a light shielding section formed in a same plane as the light transmitting section, and formed on an opposite side from the pixel circuit in relation to the light emitting element, a light reflecting section formed in a region facing the light shielding section, and between the light emitting element and the filtering layer, and a light receiving element formed in a region facing the light shielding section, and on the pixel circuit side in relation to the light emitting element.

In the first display panel and the first display device according to the embodiment of the present invention, the light reflecting section is provided in the region facing the light shielding section, and between the light emitting element and the filtering layer. Moreover, the light receiving element is provided in the region facing the light shielding section, and on the pixel circuit side in relation to the light emitting element. Thereby, a part of the light emitted from the light emitting element is reflected by the light reflecting section, and enters the light receiving element. Thus, the light absorbed in the light receiving element may be converted into an electrical signal (photocurrent) in accordance with the output level of the absorbed light. As a result, it is possible to measure the light output level of the light emitting element by utilizing the electrical signal, and it is possible to estimate the deterioration degree of the light emitting element.

According to an embodiment of the present invention, there is provided a second display panel including: a plurality of pixel circuits formed in a matrix on a substrate; an insulating layer covering the plurality of pixel circuits; a plurality of light emitting elements connected to the plurality of pixel circuits, and arranged in a matrix on the insulating layer. The second display panel includes a filtering layer including a light transmitting section at least in a part of a region facing the light emitting element and a light shielding section formed in a same plane as the light transmitting section, and formed on an opposite side from the pixel circuit in relation to the light emitting element. Moreover, the second display panel includes a light receiving element formed in a region facing the light shielding section, and between the light emitting element and the filtering layer.

According to an embodiment of the present invention, there is provided a second display device including: a display panel; and a drive circuit section driving the display panel. The display panel mounted on the second display device includes a plurality of pixel circuits formed in a matrix on a substrate, an insulating layer covering the plurality of pixel circuits, a plurality of light emitting elements connected to the plurality of pixel circuits, and arranged in a matrix on the insulating layer, a filtering layer including a light transmitting section at least in a part of a region facing the light emitting element and a light shielding section formed in a same plane as the light transmitting section, and formed on an opposite side from the pixel circuit in relation to the light emitting element, and a light receiving element formed in a region facing the light shielding section, and between the light emitting element and the filtering layer.

In the second display panel and the second display device according to the embodiment of the present invention, the light receiving element is provided in the region facing the light shielding section, and between the light emitting element and the filtering layer. Thereby, a part of the light emitted from the light emitting element enters the light receiving element. Thus, the light absorbed in the light receiving element may be converted into an electrical signal (photocurrent) in accordance with the output level of the absorbed light. As a result, it is possible to measure the light output level of the light emitting element by utilizing the electrical signal, and it is possible to estimate the deterioration degree of the light emitting element.

According to the first display panel, the second display panel, the first display device, and the second display device of the embodiments of the present invention, it is possible to measure the light output level of the light emitting element by utilizing the electrical signal output from the light receiving element, and it is possible to estimate the deterioration degree of the light emitting element. Thereby, it is possible to accurately correct a video signal, and it is possible to reduce a burning. Moreover, for example, since an image is not inverted at a predetermined interval, or is not shifted to be displayed, it is possible to reduce the burning in a color display and a still image display.

Other and further objects, features and advantages of the invention will appear more fully from the following description.

DETAILED DESCRIPTION OF THE PREFERRED EMBODIMENTS

Embodiments of the present invention will be hereinafter described in detail with reference to the drawings. The description will be made in the following order:

1. First embodiment (FIGS. 1 to 6)
There is a light reflecting section immediately below a black matrix.
There is a light receiving element on a rear face of a display panel.
2. Modification of the first embodiment (FIG. 7)
There is a member inhibiting light reflected by the light reflecting section from entering a pixel circuit.
3. Second embodiment (FIG. 8)
There is a light receiving element immediately below the black matrix.
4. Modification common to the first embodiment and the second embodiment
5. Application examples (FIGS. 9 to 14)

Figure 1:
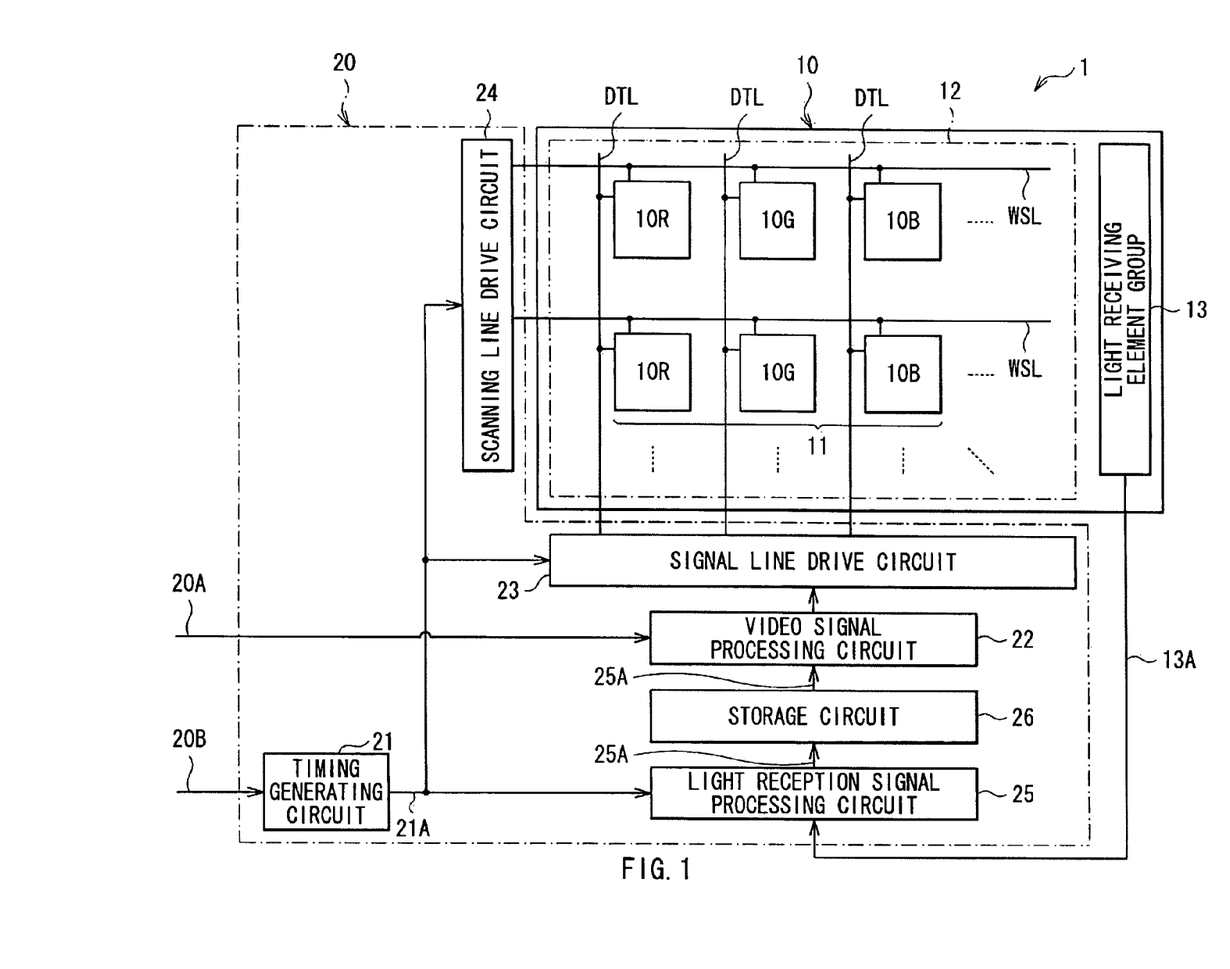
FIG. 1 is a schematic configuration view of a display device according to a first embodiment of the present invention.

First Embodiment (Schematic Configuration)
FIG. 1 illustrates the schematic configuration of a display device 1 according to a first embodiment of the present invention. The display device 1 includes a display panel 10, and a drive circuit 20 driving the display panel 10. The display panel 10 includes, for example, a display region 12 in which a plurality of organic EL elements 10R, 10G, and 10B (light emitting elements) are arranged in a matrix, and further includes a light receiving element group 13 receiving a part of light emitted from the organic EL elements 10R, 10G, and 10B. In this embodiment, for example, the organic EL elements 10R, 10G, and 10B adjacent to each other constitute a pixel 11. The drive circuit 20 includes, for example, a timing generating circuit 21, a video signal processing circuit 22, a signal line drive circuit 23, a scanning line drive circuit 24, a light reception signal processing circuit 25, and a storage circuit 26.

(Pixel Circuit)

Figure 2:
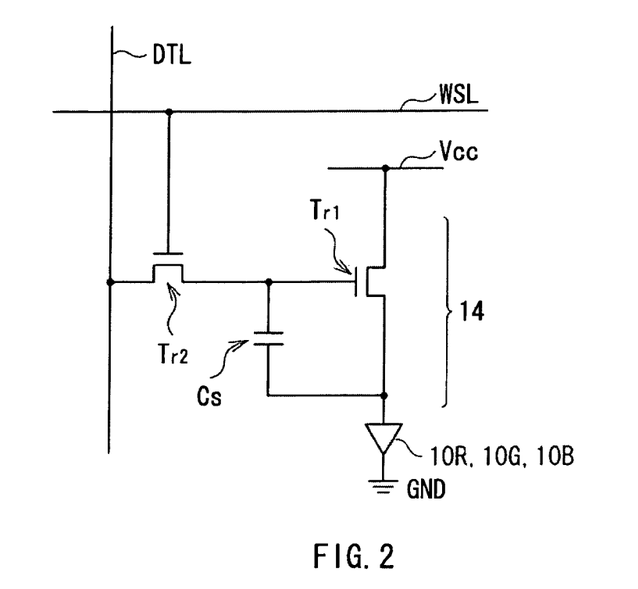
FIG. 2 is a configuration view of a pixel circuit.

FIG. 2 illustrates an example of the circuit configuration in the display region 12. In the display region 12, for example, a pixel circuit 14 as exemplified in FIG. 2 is formed. The pixel circuit 14 is, for example, formed on a support substrate 31 which will be described later. The pixel circuit 14 is composed of, for example, a drive transistor Tr1, a write transistor Tr2, and a retention capacity Cs, and its circuit configuration is 2Tr1C type. The drive transistor Tr1 and the write transistor Tr2 are, for example, formed of an n-channel MOS thin film transistor (TFT). The type of the TFT is not specifically limited. The TFT may have, for example, an unstaggered structure (so-called bottom gate type), or a staggered structure (so-called top gate type). The drive transistor Tr1 or the write transistor Tr2 may be a p-channel MOS TFT.

In the pixel circuit 14, a plurality of signal lines DTL are arranged in a column direction, and a plurality of scanning lines WSL and a plurality of power source lines Vcc are arranged in a row direction. An intersection of each signal line DTL and each scanning line WSL corresponds to one of the organic EL elements 10R, 10G, or 10B (sub-pixel). Each signal line DTL is connected to an output terminal (not illustrated in the figure) of the signal line drive circuit 23, and a drain electrode (not illustrated in the figure) of the write transistor Tr2. Each scanning line WSL is connected to an output terminal (not illustrated in the figure) of the scanning line drive circuit 24, and a gate electrode (not illustrated in the figure) of the write transistor Tr2. Each power source line Vcc is connected to an output terminal (not illustrated in the figure) of a power source, and a drain electrode (not illustrated in the figure) of the drive transistor Tr1. A source electrode (not illustrated in the figure) of the write transistor Tr2 is connected to a gate electrode (not illustrated in the figure) of the drive transistor Tr1, and one end of the retention capacity Cs. A source electrode (not illustrated in the figure) of the drive transistor Tr1, and the other end of the retention capacity Cs are connected to an anode electrode (not illustrate in the figure) of the organic EL elements 10R, 10G, and 10B. A cathode electrode (not illustrated in the figure) of the organic EL elements 10R, 10G, and 10B is connected to a ground line GND.

(Top Face Configuration and Cross-Sectional Configuration)

Figure 3:
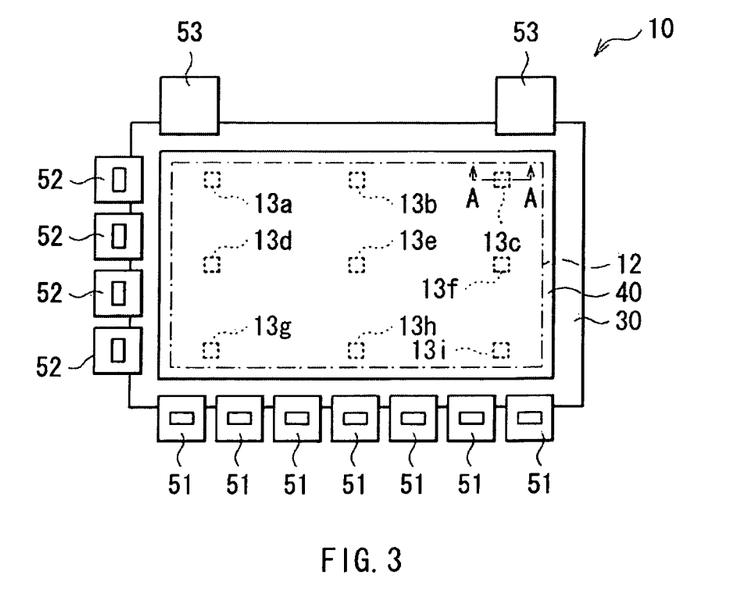
FIG. 3 is a top face view of a display panel FIG. 1.
Figure 4:
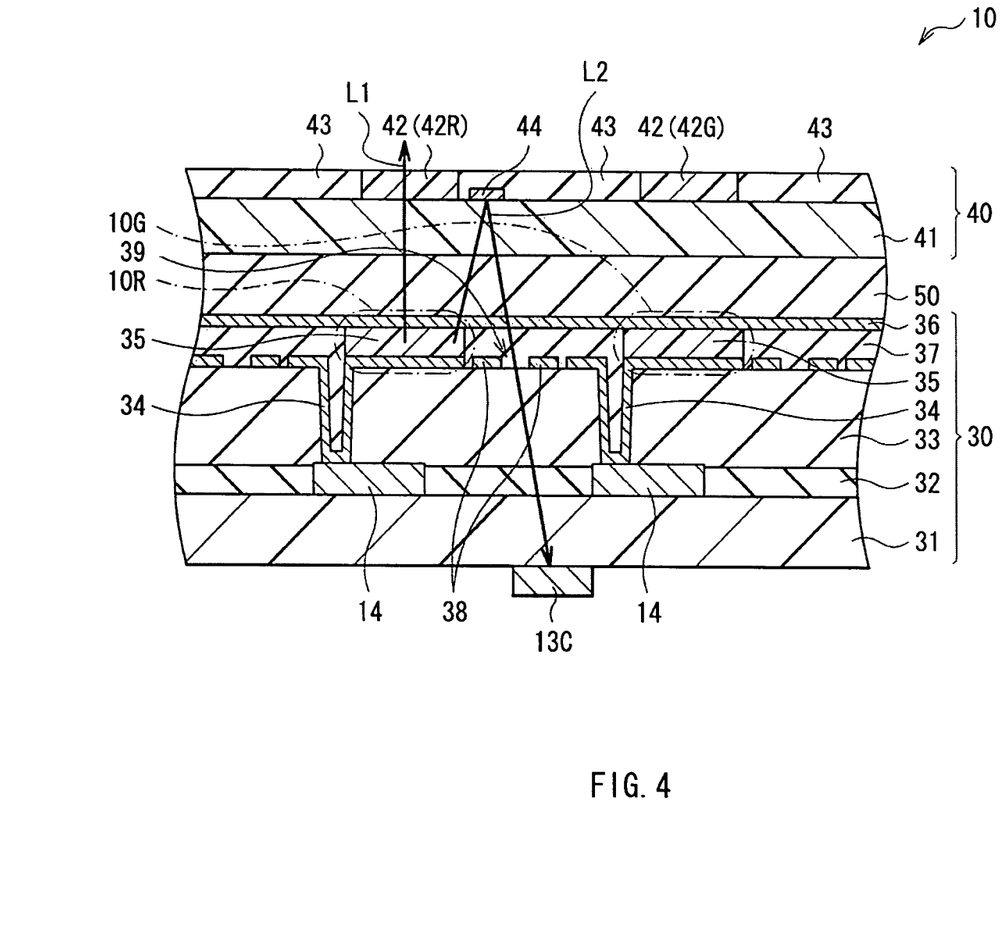
FIG. 4 is a cross-sectional view of the display panel as viewed from the direction of arrow A-A of FIG. 3.

FIG. 3 illustrates an example of the top face configuration of the display panel 10. FIG. 4 illustrates an example of the cross-sectional configuration as viewed from arrow A-A in the display panel 10 of FIG. 3. The display panel 10 has, for example, the configuration in which a drive panel 30 and a sealing panel 40 are adhered to each other with a sealing layer 50 in between.

The drive panel 30 includes the above-described pixel circuit 14 on the support substrate 31. An insulating film 32 is formed in the same plane as the pixel circuit 14. An insulating planarizing film 33 (insulating layer) is formed on the pixel circuit 14 and the insulating film 32. The top face of the insulating planarizing film 33 is in the shape of a flat plane in comparison with the base of the insulating planarizing film 33 (top face of the pixel circuit 14 and the insulating film 32). Here, the support substrate 31 is composed of, for example, a transparent substrate such as a glass substrate. The insulating film 32 and the insulting planarizing film 33 are composed of, for example, a transparent insulating material.

The drive panel 30 includes the plurality of organic EL elements 10R, 10G, and 10B arranged in a matrix at a predetermined pitch on the top face of the insulating planarizing film 33. Each of the organic EL elements 10R, 10G, and 10B has an anode electrode 34 on the insulating planarizing film 33, and includes, on the surface of the anode electrode 34, an organic layer 35 and a cathode electrode 36 in this order from the insulating planarizing film 33 side. The anode electrode 34 is electrically connected to a source electrode (not illustrated in the figure) of the drive transistor Tr1 through a through-hole formed in the insulating planarizing film 33. The cathode electrode 36 is formed over the whole display region 12, and serves as a common electrode for each of the organic EL elements 10R, 10G, and 10B. An insulating film 37 is formed in the same plane as the organic EL elements 10R, 10G, and 10B. The insulating film 37 includes an aperture arranged correspondingly to the position of the organic EL element 10, and the aperture defines the area of the light emitting region in the organic EL elements 10R, 10G, and 10B.

Here, the anode electrode 34 has a function not only as an electrode (positive electrode) injecting a current into the organic layer 35 but also a function to reflect light generated in the organic layer 35, and is composed of, for example, a metal such as aluminum. The organic layer 35 is composed of, for example, different materials depending on each of the organic EL elements 10R, 10G, and 10B. The organic layer 35 in the organic EL element 10R includes a light emitting layer made of a material in which red light emission is generated. The organic layer 35 in the organic EL element 10G includes a light emitting layer made of a material in which green light emission is generated. The organic layer 35 in the organic EL element 10B includes a light emitting layer made of a material in which blue light emission is generated. The cathode electrode 36 is composed of, for example, a transparent conductive film such as ITO (indium tin oxide). The insulating film 37 is composed of, for example, a transparent insulating material.

The drive panel 30 includes a plurality of cathode auxiliary wirings 38 on the top face of the insulating planarizing film 33, and in a region where the anode electrode is not formed. The cathode auxiliary wirings 38 are intended to uniformize the in-plane distribution of electric potential of the cathode electrode 36 formed over the whole display region 12, and electrically connected to the cathode electrode 36 in the predetermined position. For example, as illustrated in FIG. 4, each cathode auxiliary wiring 38 is arranged so as to maintain a predetermined gap 39 to the adjacent cathode auxiliary wiring 38, and the cathode electrode 36. Accordingly, it is possible for light from the sealing panel 40 side to pass through the gap 39 and reach the support substrate 31. The cathode auxiliary wiring 38 is composed of, for example, a metal such as aluminum. The cathode auxiliary wiring 38 is formed in the same plane as the anode electrode 34 as described above, and thus is preferably composed of the same material as the anode electrode 34. In that case, the cathode auxiliary wiring 38 and the anode electrode 34 may be formed in the same step, and it is possible to simplify the manufacturing step.

The drive panel 30 also includes the light receiving element group 13 inside the drive panel 30 or on the rear face of the drive panel 30. The light receiving element group 13 may be formed integrally with the organic EL elements 10R, 10G, and 10B on the support substrate 31. Alternatively, the light receiving element group 13 may be installed on the rear face of the support substrate 31 after forming the organic EL elements 10R, 10G, 10B, and the like on the support substrate 31. As illustrated in FIG. 3, for example, the light receiving element group 13 is formed of a plurality of light receiving elements 13a to 13i. The plurality of light receiving elements 13a to 13i are, for example, photodiodes. The plurality of light receiving elements 13a to 13i are, for example, arranged in a matrix at predetermined intervals, and are arranged one by one in each of nine regions (12A to 12I) formed by dividing the display region 12 as illustrated, for example, in FIG. 5. The division number of the display region 12 may be set according to needs, and may be nine or more, or less than nine. The number of the light receiving elements included in each region may be set according to needs, and may be two or more.

In the drive panel 30, as illustrated in FIG. 3, for example, a video signal supplier TAB 51 is installed on one side (long side) of the drive panel 30, and a scanning signal supplier TAB 52 is installed on the other side (short side) of the drive panel 30. As illustrated in FIG. 3, for example, a power source supplier TCP 53 is installed on one side (long side) of the drive panel 30 but different from the side of the video signal supplier TAB 51. The video signal supplier TAB 51 is formed by aerially wiring an IC in which the signal line drive circuits 23 are integrated to an aperture of a film-shaped wiring substrate. The scanning signal supplier TAB 52 is formed by aerially wiring an IC in which the scanning line drive circuits 24 are integrated to an aperture of a film-shaped wiring substrate. The power source supplier TCP 53 is formed by forming a plurality of wirings which electrically connects an external power source and the power supply line Vcc each other on a film. The signal line drive circuit 23 and the scanning line drive circuit 24 may not be formed in the TABs, but may be formed on, for example, the support substrate 31.

The sealing panel 40 includes a sealing substrate 41 which seals the organic EL elements 10R, 10G, and 10B. The sealing substrate 41 is composed of, for example, a transparent substrate such as a glass substrate. The sealing panel 40 includes, for example, a color filter 42 (light transmitting section). The color filter 42 is provided, for example, on the side where the organic EL elements 10R, 10G, and 10B emit light on the surface of the sealing substrate 41. The color filter 42 includes, for example, a filter for red 42R, a filter for green 42G, and a filter for blue 42B (not illustrated in the figure) corresponding to the organic EL elements 10R, 10G, and 10B, respectively. The filters 42R, 42G, and 42B are formed in a matrix at the same arrangement pitch as the organic EL elements 10R, 10G, and 10B, and face the organic layer 35, respectively. These filters 42R, 42G, and 42B are composed of, for example, a resin into which a pigment is mixed, respectively, and are adjusted by selecting the pigment so that the light transmittance is high in an intended wavelength region of red, green, or blue, and the light transmittance is low in a wavelength region other than the intended wavelength region.

The sealing panel 40 includes a black matrix 43 (light shielding section) in the same plane as the color filter 42 and along an interface of the filters 42R, 42G, and 42B. The black matrix 43 is intended to prevent light leakage (crosstalk) to the adjacent pixel 11. The black matrix 43 is composed of, for example, a black resin into which a black colorant is mixed. In addition, the color filter 42 and the black matrix 43 of this embodiment correspond to a specific example of "filtering layer" of the present invention.

Moreover, the sealing panel 40 includes the light reflecting section 44. The light reflecting section 44 reflects a part of light $L_2$ emitted from the organic EL element 10, and allows the light to enter the light receiving element group 13. The light reflecting section 44 is formed in a region facing the black matrix 43 in the sealing panel 40, and is formed, for example, on the surface of the sealing substrate 41 (the surface on the black matrix 43 side or the surface on the drive panel 30 side), or inside the sealing substrate 41. The light reflecting section 44 is composed of, for example, a metal such as aluminum.

(Drive Circuit)

Next, each circuit in the drive circuit 20 provided on the periphery of the display region 12 will be described with reference to FIGS. 1 and 3. FIG. 3 illustrates an example of the top face configuration of the display panel 10. The timing generating circuit 21 controls the signal line drive circuit 23, the scanning line drive circuit 24, and the light reception signal processing circuit 25 to operate in conjunction with each other. The timing generating circuit 21 outputs, for example, a control signal 21A to these circuits in response to (in synchronization with) a synchronization signal 20B input from the external. The timing generating circuit 21 is formed together with the video signal processing circuit 22, the light reception signal processing circuit 25, and the storage circuit 26, for example, on a control circuit substrate (not illustrated in the figure) provided separately from the display panel 10.

The video signal processing circuit 22 corrects a digital video signal 20A input from the external, and converts the corrected video signal into an analogue signal to output the analogue signal to the signal line drive circuit 23. In this embodiment, the video signal processing circuit 22 corrects the video signal 20A by using a correction coefficient 25A input from the storage circuit 26. For example, the video signal processing circuit 22 reads the correction coefficient 25A from the storage circuit 26 at the time of power-on of the display device 1, and corrects the video signal 20A by multiplying the read correction coefficient 25A by the video signal 20A. At this time, the video signal processing circuit 22 weights the correction coefficient 25A in accordance with the level of gray scale of the (not-yet-corrected) video signal 20A input from the external, and may correct the video signal 20A by using the weighted correction coefficient 25A. For example, a table relevant to the correspondence relationship between the level of the gray scale, and the level of the weight are previously stored in the storage circuit 26 or the like, and the video signal processing circuit 22 reads the table from the storage circuit 26, for example, at the time of power-on of the display device 1.

The signal line drive circuit 23 outputs the analogue video signal input from the video signal processing circuit 22 to each signal line DTL in response to (in synchronization with) the input of the control signal 21A. As illustrated in FIG. 3, for example, the signal line drive circuit 23 is provided in the video signal supplier TAB 51 installed on one side (long side) of the drive panel 30. The scanning line drive circuit 24 sequentially selects one scanning line WSL from the plurality of scanning lines WSL in response to (in synchronization with) the input of the control signal 21A. As illustrated in FIG. 3, for example, the scanning line drive circuit 24 is provided in the scanning signal supplier TAB 52 installed on the other side (short side) of the drive panel 30.

The light reception signal processing circuit 25 derives the correction coefficient 25A on the basis of the light reception signal 13A (electrical signal) or the like input from the light receiving element group 13, and outputs the derived correction coefficient 25A to the storage circuit 26 in response to (in synchronization with) the input of the control signal 21A. The method of deriving the correction coefficient 25A will be described later. The storage circuit 26 stores the correction coefficient 25A input from the light reception signal processing circuit 25. The storage circuit reads the stored correction coefficient 25A by using the video signal processing circuit 22.

The sealing layer 50 is composed of, for example, an energy curing transparent resin such as a thermoset resin and an ultraviolet curing resin. In addition to the function to seal the organic EL elements 10R, 10G, and 10B, the sealing layer 50 has a function to bond the drive panel 30 and sealing panel 40 to each other.

Figure 5:
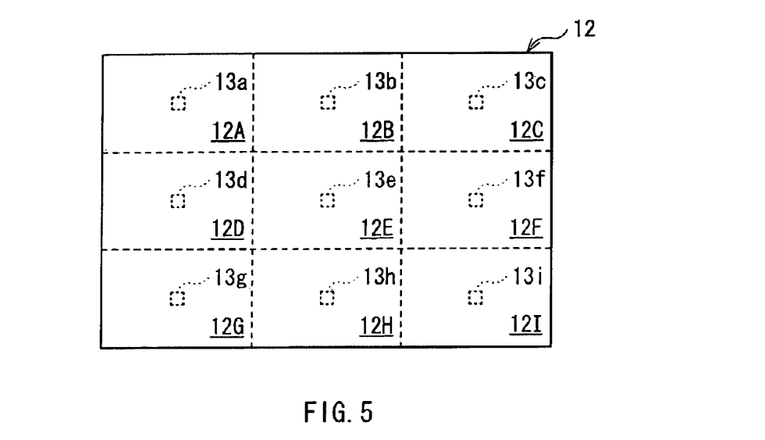
FIG. 5 is a conceptual view conceptually illustrating the state of the display panel of FIG. 1 when the display panel is divided into nine regions.
Figure 6A:
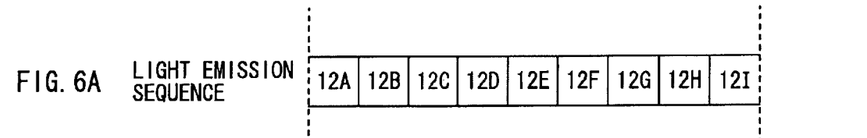
FIG. 6 is a conceptual view conceptually illustrating the state of the display panel of FIG. 4 when each region in the display panel is time-divisionally driven.
Figure 6B:
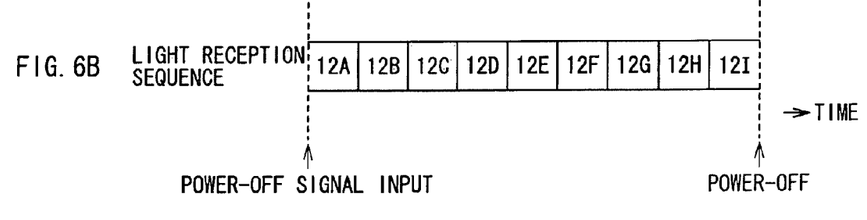

Next, an example of the method of deriving the correction coefficient 25A will be described. FIG. 6 illustrates an example of a light emission sequence and a light reception sequence when the display region 12 is divided into the nine regions (12A to 12I), and the plurality of light receiving elements 13a to 13i are arranged one by one in each region, for example, as illustrated in FIG. 5.

When a power-ff signal is input to the display device 1, first, the drive circuit 20 allows the pixel 11 corresponding to the region 12A to emit light for one frame period. Accordingly, the reflected light from the light reflecting section 44 is received in the light receiving element 13a corresponding to the region 12A, and a light reception signal 13A is output from the light receiving element 13a. The light reception signal processing circuit 25 predicts the luminance of the light output from the region 12A on the basis of the light emission position (position information of the region 12A) and the light reception signal 13A. Next, the light reception signal processing circuit 25 compares the luminance obtained by the previous prediction (prediction luminance) and the ideal luminance to be obtained by the video signal fed to the pixel 11 corresponding to the region 12A. The light reception signal processing circuit 25 derives the correction coefficient 25A to be multiplied by the video signal 20A of the pixel 11 corresponding to the region 12A at the time of next power-on. Specifically, the light reception signal processing circuit 25 derives the correction coefficient 25A as B/A, where A is the prediction luminance and B is the ideal luminance.

After that, the light reception signal processing circuit 25 derives the correction coefficient 25A in the same manner as described above. Specifically, the drive circuit 20 allows the pixel 11 corresponding to the region 12B, 12C, 12D, . . . 12I to sequentially emits light for one frame period. Correspondingly, the light reception signal processing circuit 25 predicts the luminance of the light output from the region 12B, 12C, 12D, . . . 12I on the basis of the light emission position and the light reception signal 13A. Next, after comparing the prediction luminance and the ideal luminance, the light reception signal processing circuit 25 derives the correction coefficient 25A to be multiplied by the video signal 20A of the pixel 11 corresponding to the region 12B, 12C, 12D, . . . 12I at next power-on. After that, the light reception signal processing circuit 25 stores the derived correction coefficient 25A in the storage circuit 26. In this manner, the display device 1 derives the correction coefficient 25A for all the pixels 11. In addition, after the light reception signal processing circuit 25 stores the correction coefficient 25A in the storage circuit 26, the display device 1 is powered off.

Next, actions and effects of the display device 1 of this embodiment will be described.

In the display device 1 of this embodiment, the drive transistor Tr1 is controlled to be turned on/off for each sub-pixel, and the drive current is injected into the organic EL elements 10R, 10G, and 10B of each sub-pixel. Thereby, a hole and an electron recombine to generate light emission. This light is multiply-reflected between the anode electrode 34 and the cathode electrode 36, and transmits the cathode electrode 36, the sealing layer 50, the sealing substrate 41, and the color filter 42 to be extracted.

In this embodiment, the light reflecting section 44 is arranged in a region facing the black matrix 43 arranged on the light emission side, and between the organic EL elements 10R, 10G, and 10B, and the black matrix 43. Moreover, the light receiving element group 13 (light receiving elements 13a to 13i) is arranged in a region facing the black matrix 43, and on the pixel circuit 14 side in relation to the organic EL elements 10R, 10G, and 10B. Thereby, most of the light ($L_1$) emitted from the organic EL elements 10R, 10G, and 10B is emitted outside through the color filter 42. Meanwhile, in the light emitted from the organic EL elements 10R, 10G, and 10B, a component having a wide divergence angle ($L_2$) is reflected by the light reflection section 44. The light reflected by the light reflecting section 44 passes through the gap 39 formed by the cathode auxiliary wiring 38 and the cathode electrode 36, and reaches the light receiving element group 13 to be absorbed in the light receiving element group 13. The light absorbed in the light receiving element group is converted into the light reception signal 13A (photocurrent) in accordance with the output level of the absorbed light. As a result, the light output level of the organic EL elements 10R, 10G, and 10B may be predicted by utilizing the light reception signal 13A, and thus it is possible to estimate the deterioration degree of the organic EL elements 10R, 10G, and 10B. Accordingly, the video signal 20A may be accurately corrected, and the burning may be reduced. Moreover, for example, since the existing method in which the image is inverted at the predetermined interval, or the image is shifted to be displayed is not used, it is possible to reduce the burning in the color display and the still image display.

Modification

Figure 7:
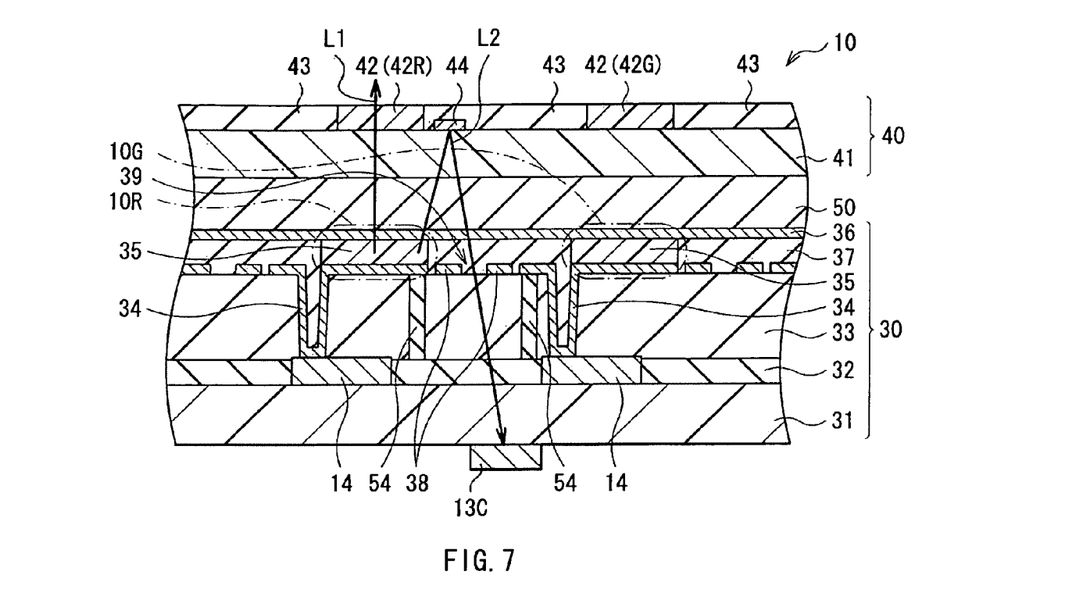
FIG. 7 is a cross-sectional view of a modification of the display panel of FIG. 1.

In the above embodiment, although a passage where the light reflected by the light reflecting section 44 (reflected light) passes through is not optically separated from the other region, the passage may be optically separated from the other region. For example, as illustrated in FIG. 7, in the periphery of the passage through which the reflected light mainly passes, a member (light reflecting section 54) inhibiting the reflected light from entering the pixel circuit 14 may be provided. The light reflecting section 54 is, for example, arranged in the layer (insulating planarizing film 33) between the pixel circuit 14 and the organic EL elements 10R, 10G, and 10B, and is composed of a material having a refractive index higher than that of the insulating planarizing film 33. Thereby, it is possible to prevent generation of the image quality deterioration such as color unevenness and luminance reduction caused by that the reflection light and stray light from the adjacent pixel 11 enter the pixel circuit 14, and the leak current of the drive transistor Tr1 in the pixel circuit 14 is increased.

Second Embodiment

Figure 8:
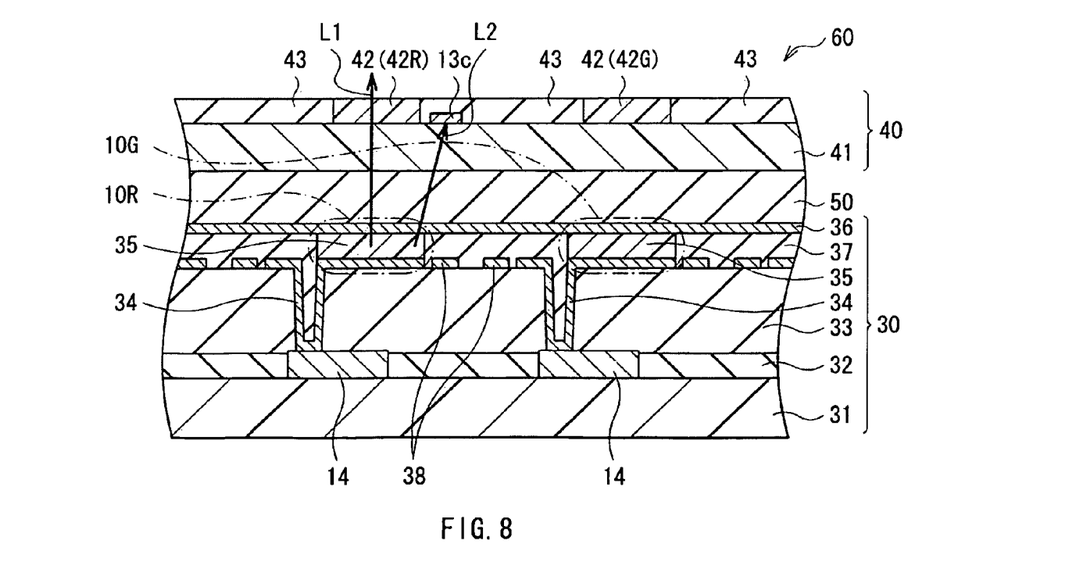
FIG. 8 is a cross-sectional view of the display panel mounted on the display device according to a second embodiment of the present invention.

FIG. 8 illustrates the schematic configuration of a display panel 60 mounted on the display device according to a second embodiment of the present invention. The configuration of the display panel 60 differs from that of the display panel of the above embodiment in that there is no light reflecting section 44, and the light receiving element group (light receiving elements 13a to 13i) is moved to inside the sealing panel 40. Therefore, hereinafter, the description will be mainly made on the difference, and the points common to the above embodiment will be appropriately omitted.

The light receiving element group 13 in this embodiment is formed in a region facing the black matrix 43 in the sealing panel 40, and is formed, for example, on the surface of the sealing substrate 41 (the surface on the back matrix 43 side or the surface on the drive panel 30 side), or formed inside the sealing substrate 41. Thereby, it is possible to detect the component ($L_2$) having the wide divergence angle in the light emitted from the organic EL elements 10R, 10G, and 10B by the light receiving element group 13. As a result, it is possible to predict the light output level of the organic EL elements 10R, 10G, and 10B by utilizing the light reception signal 13A, and thus it is possible to estimate the deterioration degree of the organic EL elements 10R, 10G, and 10B. Accordingly, the video signal 20A may be accurately corrected, and the burning may be reduced. Also in this embodiment, for example, since the existing method in which the image is inverted at the predetermined interval, or the image is shifted to be displayed is not used, it is possible to reduce the burning in the color display and the still image display.

Module and Application Examples

Hereinafter, application examples of the display device which has been described in the first embodiment and the second embodiment will be described. The display device of the above embodiments may be applied to a display device in an electronic appliance of various fields in which a video signal input from the external or a video signal generated inside the device is displayed as an image or a video, such as a television device, a digital camera, a notebook personal computer, a mobile terminal device such as a mobile phone, a video camera, or the like.

(Module)

Figure 9:
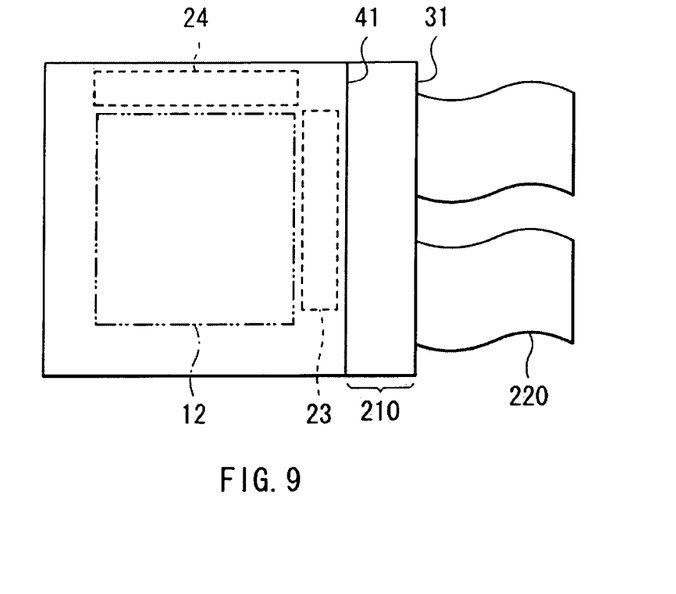
FIG. 9 is a plan view illustrating the schematic configuration of a module including a display device of the first embodiment and the second embodiment.

The display device of the above embodiments is, for example, installed as a module illustrated in FIG. 9 in various electronic appliances of a first application example to a fifth application example which will be described later. In this module, for example, an exposed region 210 exposed from the sealing substrate 41 and the sealing layer 50 is provided on one side of the support substrate 31, and an external connection terminal (not illustrated in the figure) is formed by extending the wiring of the signal line drive circuit 23 and the scanning line drive circuit 24 in the exposed region 210. In the external connection terminal, a flexible printed circuit (FPC) 220 may be provided for input/output of a signal.

First Application Example

Figure 10:
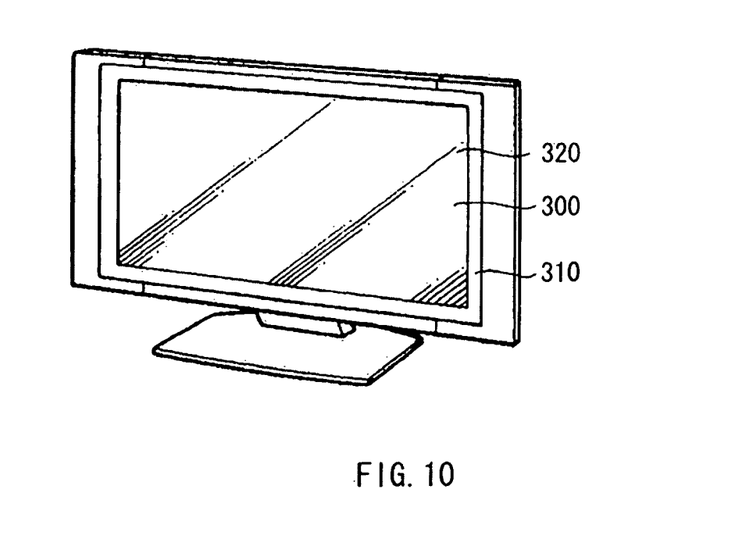
FIG. 10 is a perspective view illustrating an appearance of a first application example of the display device of the first embodiment and the second embodiment.

FIG. 10 illustrates an appearance of a television device to which the display device of the above embodiments is applied. The television device includes, for example, a video display screen section 300 including a front panel 310 and a filter glass 320. The video display screen section 300 is composed of the display device according to the above embodiments.

Second Application Example

Figure 11A:
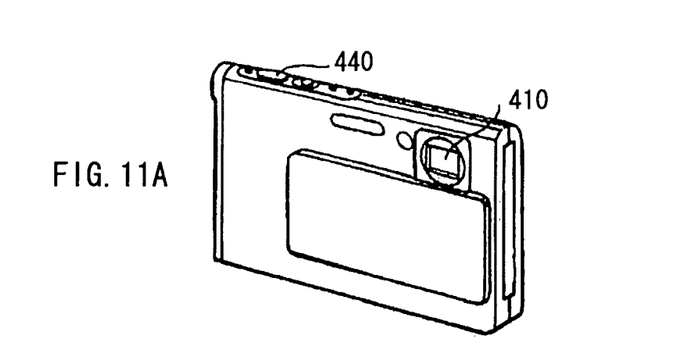
FIG. 11A is a perspective view illustrating an appearance of a second application example as viewed from the front side.
Figure 11B:
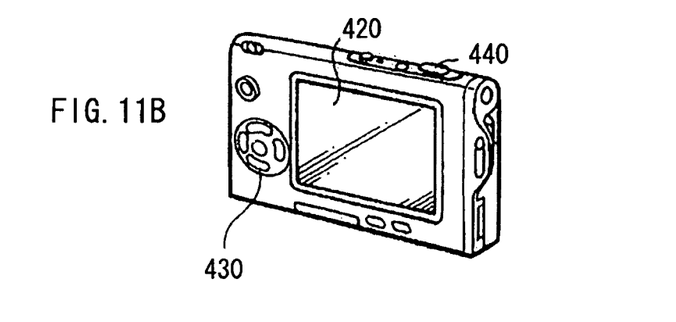
FIG. 11B is a perspective view illustrating the appearance as viewed from the rear side.

FIG. 11 illustrates an appearance of a digital camera to which the display device of the above embodiments is applied. The digital camera includes, for example, a light emitting section for a flash 410, a display section 420, a menu switch 430, and a shutter button 440. The display section 420 is composed of the display device according to the above embodiments.

Third Application Example

Figure 12:
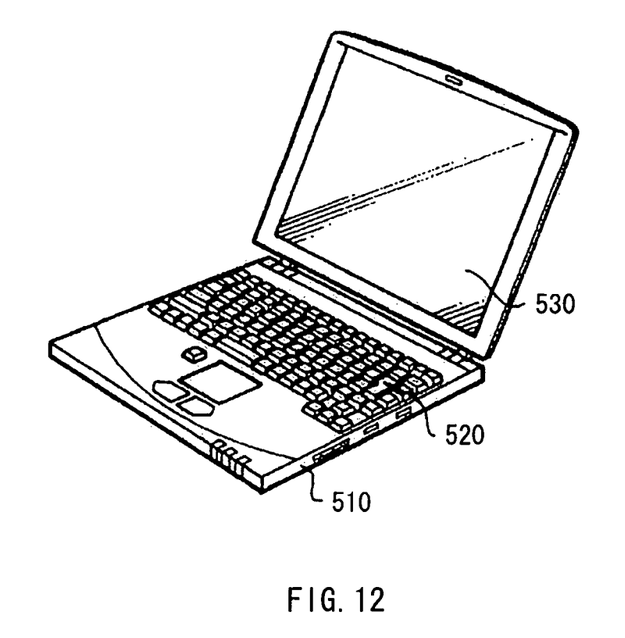
FIG. 12 is a perspective view illustrating an appearance of a third application example.

FIG. 12 illustrates an appearance of a notebook personal computer to which the display device of the above embodiments is applied. The notebook personal computer includes, for example, a main body 510, a keyboard 520 for input operation of characters and the like, and a display section 530 for displaying an image. The display section 530 is composed of the display device according to the above embodiments.

Fourth Application Example

Figure 13:
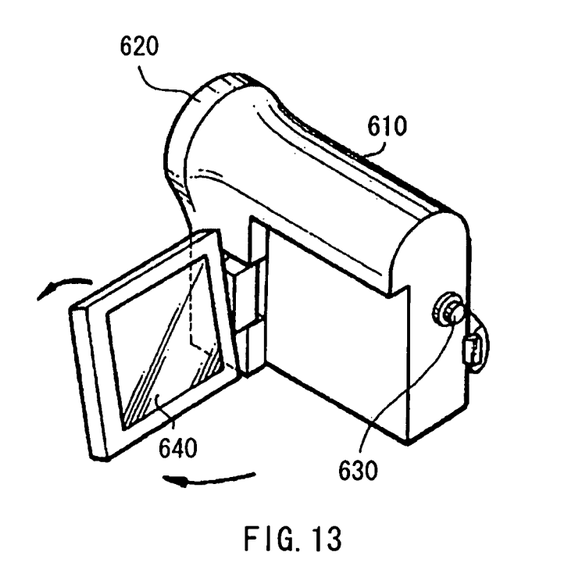
FIG. 13 is a perspective view illustrating an appearance of a fourth application example.
Figure 14A:
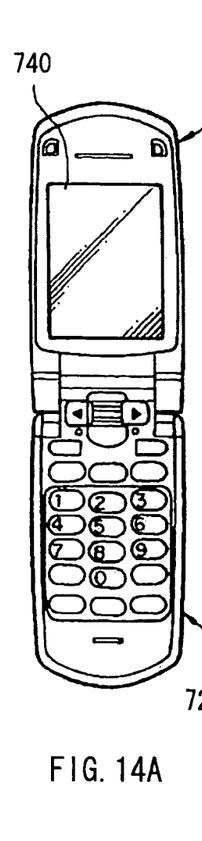
FIG. 14A is an elevation view of a fifth application example unclosed.
Figure 14B:
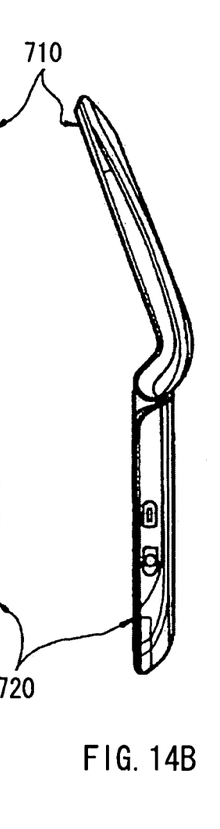
FIG. 14B is a side view thereof.
Figures 14C, 14E, 14G:
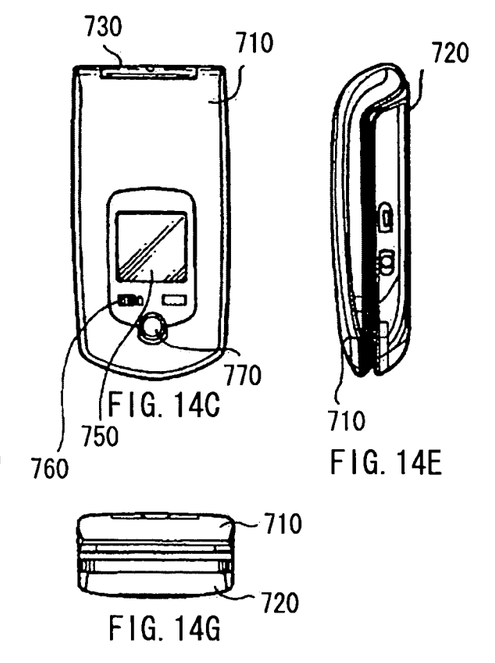
FIG. 14C is an elevation view of the fifth application example closed.
FIG. 14E is a right side view thereof.
FIG. 14G is a bottom face view thereof.
Figure 14D:
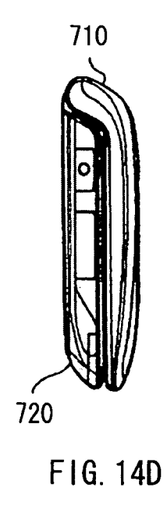
FIG. 14D is a left side view thereof.
Figure 14F:
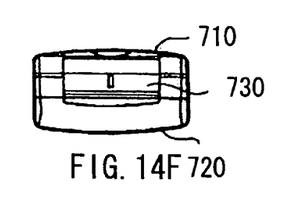
FIG. 14F is a top face view thereof.

FIG. 13 illustrates an appearance of a video camera to which the display device of the above embodiments is applied. The video camera includes, for example, a main body 610, a lens for capturing an object 620 provided on the front side face of the main body 610, a start/stop switch in capturing 630, and a display section 640. The display section 640 is composed of the display device according to the above embodiments.

Fifth Application Example

FIG. 14 illustrates an appearance of a mobile phone to which the display device of the above embodiments is applied. In the mobile phone, for example, an upper package 710 and a lower package 720 are joined by a joint section (hinge section) 730. The mobile phone includes a display 740, a sub-display 750, a picture light 760, and a camera 770. The display 740 or the sub-display 750 is composed of the display device according to the above embodiments.

Hereinbefore, although the present invention has been described with reference to the embodiments, the present invention is not limited to the embodiments, and various modifications may be made.

For example, the material, the thickness, the film-forming method, the film-forming conditions and the like of each layer are not limited to those described in the above embodiments. Other material, other thickness, other film-forming method, and other film-forming conditions may be adopted. For example, in the above embodiments, the case where the anode electrode 34, the organic layer 35, and the cathode electrode 36 are stacked on the support substrate 31 in this order from the support substrate 31 side, and the light is extracted from the sealing substrate 41 side has been described. However, by reversing the stacking order, the cathode electrode 36, the organic layer 35, and the anode electrode 34 are stacked on the support substrate 31 in this order from the support substrate 31 side, and the light may be extracted from the support substrate 31 side.

Moreover, for example, although the case where the anode electrode 34 is regarded as a positive electrode, and the cathode electrode 36 is regarded as a negative electrode has been described in the above embodiments, the positive electrode and the negative electrode may be reversed.

In addition, although the case of the active matrix type display device has been described in the above embodiments, the present invention may be applied to a passive matrix type display device. Moreover, the configuration of the pixel drive circuit for the active matrix drive is not limited to the configuration which has been described in the above embodiments, and a capacitive element and a transistor may be added according to needs. In that case, according to the change of the pixel drive circuit, a necessary drive circuit may be added in addition to the signal line drive circuit 23 and the scanning line drive circuit 24.

It should be understood by those skilled in the art that various modifications, combinations, sub-combinations and alternations may occur depending on design requirements and other factors insofar as they are within the scope of the appended claims or the equivalents thereof.

What is claimed is:

1. A display panel comprising:
   a plurality of pixel circuits formed in a matrix on a substrate;
   an insulating layer covering the plurality of pixel circuits;
   a plurality of light emitting elements for emitting light and connected to the plurality of pixel circuits, and arranged in a matrix on the insulating layer;
   a filtering layer including a light transmitting section at least in a part of a region facing the light emitting element and a light shielding section, and formed on an opposite side from the pixel circuit in relation to the light emitting element;
   a light reflecting section formed in a region between the light emitting element and the filtering layer; and
   a light receiving element formed in a region facing the light shielding section, and on the pixel circuit side in relation to the light emitting element,
   the light transmitting section being a color filter to enable an intended wavelength region or regions of emitted light from the light emitting elements to be transmitted therethrough, and
   the light transmitting section, the light shielding section, the reflecting section, and the light receiving element being arranged such that (i) the light transmitting section and the light shielding section are in a same plane and (ii) the region to which the light reflecting section is formed faces the light shielding section so as to be in-line with the light shielding section and to not face or be in-line with the light emitting element, so that during operation
   a first part of the light emitted from the light emitting element(s) passes through the light transmitting section, and
   a second part of the light emitted from the light emitting element(s) is reflected by the light reflecting section and passes to the light receiving element,
   in which the first part of the light represents an amount of light which is larger than that of the second part of the light.

2. The display panel according to claim 1, wherein the light receiving element is formed on the opposite side from the pixel circuit in relation to the substrate.

3. The display panel according to claim 1, wherein the light receiving element is formed on the pixel circuit side in relation to the substrate.

4. The display panel according to claim 1, further comprising
   a member inhibiting light reflected by the light reflecting section in light emitted from the light emitting element from entering the pixel circuit.

5. The display panel according to claim 1, further comprising a member which inhibits the light reflected by the light reflecting section from entering the pixel circuit and allows the light reflected by the light reflecting section to pass to the light receiving element.

6. A display panel comprising:
   a plurality of pixel circuits formed in a matrix on a substrate;
   an insulating layer covering the plurality of pixel circuits;
   a plurality of light emitting elements for emitting light and connected to the plurality of pixel circuits, and arranged in a matrix on the insulating layer;
   a filtering layer including a light transmitting section at least in a part of a region facing the light emitting element and a light shielding section formed in a same plane as the light transmitting section, and formed on an opposite side from the pixel circuit in relation to the light emitting element; and
   a light receiving element formed in a region facing the light shielding section, and between the light emitting element and the filtering layer,
   the light transmitting section being a color filter to enable an intended wavelength region or regions of emitted light from the light emitting elements to be transmitted therethrough, and
   the light transmitting section, the light shielding section, the reflecting section, and the light receiving element being arranged such that (i) the light transmitting section and the light shielding section are in a same plane and (ii) the region to which the light reflecting section is formed faces the light shielding section so as to be in-line with the light shielding section and to not face or be in-line with the light emitting element, so that during operation
   a first part of the light emitted from the light emitting element(s) passes through the light transmitting section, and
   a second part of the light emitted from the light emitting element(s) is reflected by the light reflecting section and passes to the light receiving element,
   in which the first part of the light represents an amount of light which is larger than that of the second part of the light.

7. A display device comprising:
   a display panel; and
   a drive circuit section driving the display panel, wherein
   the display panel includes
   a plurality of pixel circuits formed in a matrix on a substrate,
   an insulating layer covering the plurality of pixel circuits,
   a plurality of light emitting elements for emitting light and connected to the plurality of pixel circuits, and arranged in a matrix on the insulating layer,
   a filtering layer including a light transmitting section at least in a part of a region facing the light emitting element and a light shielding section formed in a same plane as the light transmitting section, and formed on an opposite side from the pixel circuit in relation to the light emitting element,
   a light reflecting section formed in a region facing the light shielding section, and between the light emitting element and the filtering layer, and
   a light receiving element formed in a region facing the light shielding section, and on the pixel circuit side in relation to the light emitting element,
   the light transmitting section being a color filter to enable an intended wavelength region or regions of emitted light from the light emitting elements to be transmitted therethrough, and
   the light transmitting section, the light shielding section, the reflecting section, and the light receiving element being arranged such that (i) the light transmitting section and the light shielding section are in a same plane and (ii) the region to which the light reflecting section is formed faces the light shielding section so as to be in-line with the light shielding section and to not face or be in-line with the light emitting element, so that during operation
   a first part of the light emitted from the light emitting element(s) passes through the light transmitting section, and a second part of the light emitted from the light emitting element(s) is reflected by the light reflecting section and passes to the light receiving element, in which the first part of the light represents an amount of light which is larger than that of the second part of the light.

8. The display device according to claim 7, wherein the drive circuit section drives the pixel circuit based on an electrical signal output from the light receiving element and a video signal input from an external.

9. A display device comprising:

a display panel; and a drive circuit section driving the display panel, wherein the display panel includes a plurality of pixel circuits formed in a matrix on a substrate, an insulating layer covering the plurality of pixel circuits, a plurality of light emitting elements for emitting light and connected to the plurality of pixel circuits, and arranged in a matrix on the insulating layer, a filtering layer including a light transmitting section at least in a part of a region facing the light emitting element and a light shielding section formed in a same plane as the light transmitting section, and formed on an opposite side from the pixel circuit in relation to the light emitting element, and a light receiving element formed in a region facing the light shielding section, and between the light emitting element and the filtering layer, the light transmitting section being a color filter to enable an intended wavelength region or regions of emitted light from the light emitting elements to be transmitted therethrough, and the light transmitting section, the light shielding section, the reflecting section, and the light receiving element being arranged such that (i) the light transmitting section and the light shielding section are in a same plane and (ii) the region to which the light reflecting section is formed faces the light shielding section so as to be in-line with the light shielding section and to not face or be in-line with the light emitting element, so that during operation a first part of the light emitted from the light emitting element(s) passes through the light transmitting section, and a second part of the light emitted from the light emitting element(s) is reflected by the light reflecting section and passes to the light receiving element, in which the first part of the light represents an amount of light which is larger than that of the second part of the light.

* * * * *